United States Patent [19]

Gomez

[11] 4,156,200
[45] May 22, 1979

[54] HIGH RELIABILITY ACTIVE-STANDBY CLOCK ARRANGEMENT

[75] Inventor: Ernest Gomez, Naperville, Ill.

[73] Assignee: Bell Telephone Laboratories, Incorporated, Murray Hill, N.J.

[21] Appl. No.: 888,162

[22] Filed: Mar. 20, 1978

[51] Int. Cl.² ............................................. H03K 3/00
[52] U.S. Cl. .................................... 328/61; 307/269; 307/219; 328/104
[58] Field of Search ........................ 328/61, 103, 104; 307/260, 219, 269

[56] References Cited

U.S. PATENT DOCUMENTS

| | | | |
|---|---|---|---|
| 3,289,097 | 11/1966 | Martin | 307/219 X |
| 3,479,603 | 11/1969 | Overstreet, Jr. | 328/61 |
| 3,751,685 | 8/1973 | Jaeger | 307/219 |

*Primary Examiner*—John Zazworsky
*Attorney, Agent, or Firm*—Peter Visserman

[57] ABSTRACT

A clock pulse circuit is disclosed in which two clock pulse generators operate in an active-standby circuit arrangement to provide a highly reliable single clock output signal comprising a sequence of repetitive pulses. The arrangement comprises a plurality of counters to count pulses generated by each of the clock pulse generators. Comparison circuitry connected to the counters generates an inequality signal indicative of an apparent failure of one of the generators. Logic circuitry responsive to the inequality signal will cause subsequent clock output pulses to be derived from the operating pulse generator. In one embodiment of this invention an actual failure is distinguished from an allowable phase drift of the generator output signal. Another embodiment utilizes additional counters responsive to complementary generator output signals to maintain an uninterrupted sequence of clock output pulses regardless of a failure in either pulse generator.

17 Claims, 9 Drawing Figures

HIGH RELIABILITY ACTIVE-STANDBY CLOCK ARRANGEMENT

TECHNICAL FIELD

This invention relates to clock circuits for use in electronic processors and, more particularly, to active-standby clock circuit arrangements for providing continuous clock output pulses in the presence of a clock circuit failure or phase shifting of clock pulse generator signals.

BACKGROUND ART

It is necessary to achieve a high state of reliability in many vital components of modern communication systems, e.g., electronic telephone switching systems. One vital component of any communication system is a system clock circuit. High reliability is often achieved in these circuits via the utilization of duplicated circuitry, allowing continued operation in the presence of a component failure and during the time necessary to repair such a failure.

Several schemes exist within the prior art which utilize the concept of duplicated system clock circuitry. However, each of these schemes suffers from limitations not found in the present invention. One prior art disclosure is U.S. Pat. No. 3,965,432, J. Denenberg et al., involving the use of two clock pulse generators, each of which normally provides alternate output signals of the clock circuit. In the presence of a failure of one of the pulse generators, all subsequent output pulses are produced by that pulse generator which has not failed. However, at the time of failure, an output pulse may be stretched or delayed with this arrangement. A further limitation of this arrangement is that the circuitry cannot withstand a substantial phase shift differential between the output signals of the two clock pulse generators. Such a differential produces irregular output pulses. A further prior art disclosure is U.S. Pat. No. 4,025,874, D. L. Abbey, involving a standby clock circuit being switched into operation upon the failure of an on-line clock circuit. However, the circuitry found in this prior art may produce the loss of several clock output pulses and further result in extensive system disruption if a phase shift differential occurs between the output signals of the clock pulse generators.

DISCLOSURE OF THE INVENTION

Advantageously, a technical advance is achieved by a highly reliable clock circuit arrangement utilizing only two clock pulse generators whereby a continuous sequence of clock output pulses is produced regardless of a failure in either clock pulse generator and regardless of whether the output signal of the failed clock pulse generator is in a high state or a low state. The arrangement of the invention further allows a greater maximum phase shift differential between clock pulse generator output signals than prior art circuits, while also providing continuous clock circuit operation without system disruption.

The clock pulse circuit arrangement comprises first and second clock pulse generators and control circuitry for selectively applying to a clock output terminal a sequence of clock output pulses corresponding either to a sequence of repetitive signal pulses generated by the first clock pulse generator or to a sequence of repetitive signal pulses generated by the second clock pulse generator. In accordance with this invention, the control circuitry comprises a first counter associated with the first clock pulse generator and a second counter associated with the second clock pulse generator wherein each counter is adapted to count the pulses of the sequence of repetitive signal pulses generated by the associated clock pulse generator and to generate counting signals indicative of the state of the corresponding counter. Comparison circuitry is connected to each of the aforementioned counters and is utilized for comparing counting signals generated by the first and second counters and for generating a counter inequality signal when the state of the second counter indicates a higher value than than indicated by the state of the first counter. Logic circuitry is connected to each of the clock pulse generators and is initially adapted to apply to the clock pulse output terminal a sequence of clock output pulses corresponding to the sequence of repetitive signal pulses of the first clock pulse generator. The logic circuitry is responsive to the counter inequality signal to inhibit the application of the sequence of output pulses corresponding to the sequence of signal pulses of the first clock pulse generator and to apply a sequence of clock output pulses corresponding to the sequence of repetitive signal pulses of the second clock pulse generator at the clock output terminal.

The aforementioned comparison circuitry further generates an additional inequality signal when the counting signals generated by the first and the second counters indicate that the state of the first counter is greater than that of the second counter. The logic circuitry is responsive to the additional inequality signal to inhibit the application of the sequence of output pulses corresponding to signal pulses of the second clock pulse generator to apply a sequence of clock output pulses corresponding to the sequence of repetitive signal pulses of the first clock pulse generator at the clock output terminal.

Additionally, the first and second clock pulse generators are connected to a circuit means for deriving an additional sequence of signal pulses from each of the sequences of repetitive signal pulses of the first and second clock pulse generators, respectively. Control circuitry further comprises third and fourth counters wherein the third counter is associated with the first clock pulse generator and the fourth counter is associated with the second clock pulse generator and each of the counters is adapted to count the pulses of the additional sequence of signal pulses derived from the sequence of repetitive signal pulses of the associated clock pulse generator and to provide counting signals indicative of the state of the counter. Comparison circuitry is further connected to the third and fourth counters and is responsive to the associated counting signals to further provide the counte inequality signal when the counting value indicated by the state of the fourth counter exceeds that of the counting value indicated by the state of the third counter.

A method for achieving the advantages of the invention includes the steps of counting pulses of first and second sequences of repetitive signal pulses generated by first and second clock pulse generators, respectively, and generating first and second sets of counting signals. The sets of counting signals are compared and a first inequality signal is generated when the first set of counting signals has a greater value than the second set of counting signals. Additionally, a second inequality signal is generated when the second set of counting signals has a greater value than the first set of inequality signals.

A clock output signal at a clock output terminal is then generated correspondent to the first repetitive signal pulses in the presence of the first inequality signal and correspondent to the second repetitive signal pulses in the presence of the second inequality signal.

BRIEF DESCRIPTION OF THE DRAWING

The invention may be understood from the following detailed description when read with reference to the drawing in which.

DETAILED DESCRIPTION

Figures 1, 8, 9:
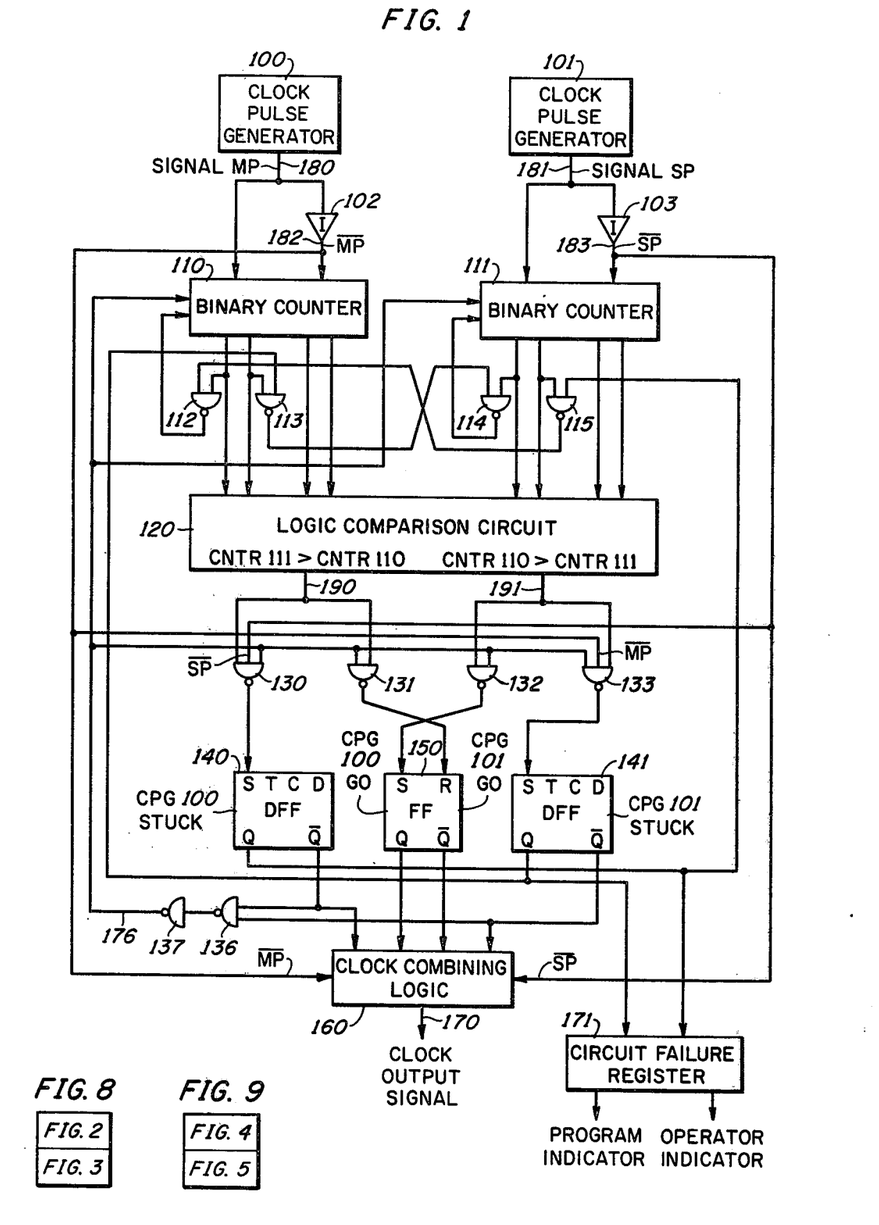
FIG. 1 is a block diagram of one illustrative embodiment of an active-standby clock pulse circuit arrangement in accordance with the invention.
FIGS. 8 and 9 show the arrangements of FIGS. 2, 3, and FIGS. 4, 5, respectively.

One illustrative embodiment of a highly reliable active-standby clock pulse circuit arrangement according to the invention is shown in FIG. 1 in block diagram form. The circuit comprises two clock pulse generators. A first clock pulse generator 100 generates a sequence of repetitive clock pulse signals shown as signal MP on conductor 180 in FIG. 1 while a second clock pulse generator 101 generates a sequence of repetitive clock pulse signals shown as signal SP on conductor 181. Signal $\overline{MP}$, shown as the output signal of inverter 102 on conductor 182 and signal $\overline{SP}$, shown as the output signal of inverter 103 on conductor 183 are the complements of signals MP and SP, respectively.

A function of this illustrative embodiment of the present invention is to provide, at output terminal 170, a clock output signal corresponding to signal MP when clock pulse generator 101 is in an apparent failure state and a clock output signal corresponding to signal SP when clock pulse generator 100 is in an apparent failure state. For purposes of description, the "active" clock pulse generator is defined as that which is generating repetitive signals to which the clock output signal presently corresponds. The other clock pulse generator is then designated as the "standby" pulse generator.

Binary counters 110 and 111 are utilized to count the repetitive pulses of signals MP and SP, respectively. The binary counting output signals of counters 110 and 111 are utilized as input signals to logic comparison circuit 120. If counter 111 has a greater counting value than counter 110, indicating that the first clock pulse generator 100 is in an apparent failure state, an inequality signal is generated on conductor 190. Similarly, if counter 110 has a greater counting value than counter 111, indicative of the second clock pulse generator 101 being in an apparent failure state, an inequality signal is generated on conductor 191 by logic comparison circuit 120.

When a clock pulse generator is the presently active clock pulse generator, flip-flop 150 and clock combining logic circuit 160 are in states such that the clock output signal on conductor 170 corresponds to the repetitive signals of that clock pulse generator. If the inequality signal generated at the output of logic comparison circuit 120 on conductor 190 or 191 indicates the apparently failed clock pulse generator to be the presently active clock pulse generator, flip-flop 150 will immediately switch states such that the previously designated standby clock pulse generator now becomes the active clock pulse generator and the clock output signal on conductor 170 subsequently corresponds to the repetitive signals of the previously designated standby clock pulse generator. Thus, if the first clock pulse generator 100 was initially designated as the active clock pulse generator, and the inequality signal generated by logic comparison circuit 120 was indicative of the first clock pulse generator 100 being in an apparent failure state, i.e., the inequality signal was present on conductor 190, then flip-flop 150 will switch states, and subsequent clock output pulses occurring on conductor 170 will correspond to the repetitive signals of second clock pulse generator 101.

Additionally, when first clock pulse generator 100 is determined to be in an actual failure state, flip-flop 140 will be set, indicative of this failure. Similarly, when the second clock pulse generator 101 is determined to be in an actual failure state, flip-flop 141 will accordingly be set. It is a feature of this invention to delay setting either of these flip-flops for a predetermined period of time to allow phase shift between signals MP and SP without false indication of an actual clock circuit failure. A phase shift between signals MP and SP will cause counters 110 and 111 to generate unequal binary counting values and logic comparison circuit 120 to generate an inequality signal on either conductor 190 or 191. If the inequality signal is present on conductor 190, indicative of an apparent failure of clock pulse generator 100, gating circuit 130 will delay the setting of flip-flop 140 for approximately one-half pulse period after the inequality signal on conductor 190 is initially generated by logic comparison circuit 120. Similarly, with an apparent failure in clock pulse generator 101, causing comparison circuit 120 to generate an inequality signal on conductor 191, gating circuit 133 will delay the setting of flip-flop 141 for approximately one-half pulse period. If a pulse is generated by the apparently failed clock pulse generator during the aforementioned delay period (less a minimal time period allowance for circuit delay), the inequality signal on conductor 190 or 191 will cease and neither flip-flop 140 nor 141 will be set. Thus, a substantial, but allowable phase shift between signals MP and SP will not give a false indication of a circuit failure. This feature will be clearly shown in subsequent discussion of the circuit operation of FIGS. 2 and 3. It will also be shown that when a phase shift does occur between signals MP and SP, flip-flop 150 may switch states once, but will not continuously switch with each new clock pulse as occurs in certain of the relevant prior art. Continuous switching would produce irregular clock output pulses.

When a failure is indicated by the setting of either flip-flop 140 or 141, the output signal at the $\overline{Q}$ output terminal of the indicative flip-flop is utilized as an input signal to a gate-inhibiting circuit comprising gates 136 and 137. An inhibiting signal produced on conductor 176 is utilized to inhibit gates 130 through 133, prohibiting spurious signals from affecting these gates when a clock pulse generator has failed. The signal on conductor 176 further resets the most significant digits of each of binary counters 110 and 111. Additionally, the output signal at the Q output terminal of the indicative flip-flop is utilized to interlock the least significant digits of each of binary counters 110 and 111 via gates 112 through 115. Thus, upon restoration of the failed clock pulse generator, the binary counters are ensured of generating in-phase synchronous binary counting signals.

Flip-flops 140 and 141 serve an additional purpose in that they provide a failure indication to external circuitry. As shown in FIG. 1, the output signals occurring at each of the Q output terminals of flip-flops 140 and 141 are utilized as input signals to a circuit failure register 171. The failure register can be utilized by hardware circuitry to indicate to an operator that a failure has occurred in the clock circuit, or the contents of the failure register can be read by computer and appropriate action can be taken.

Figure 2:
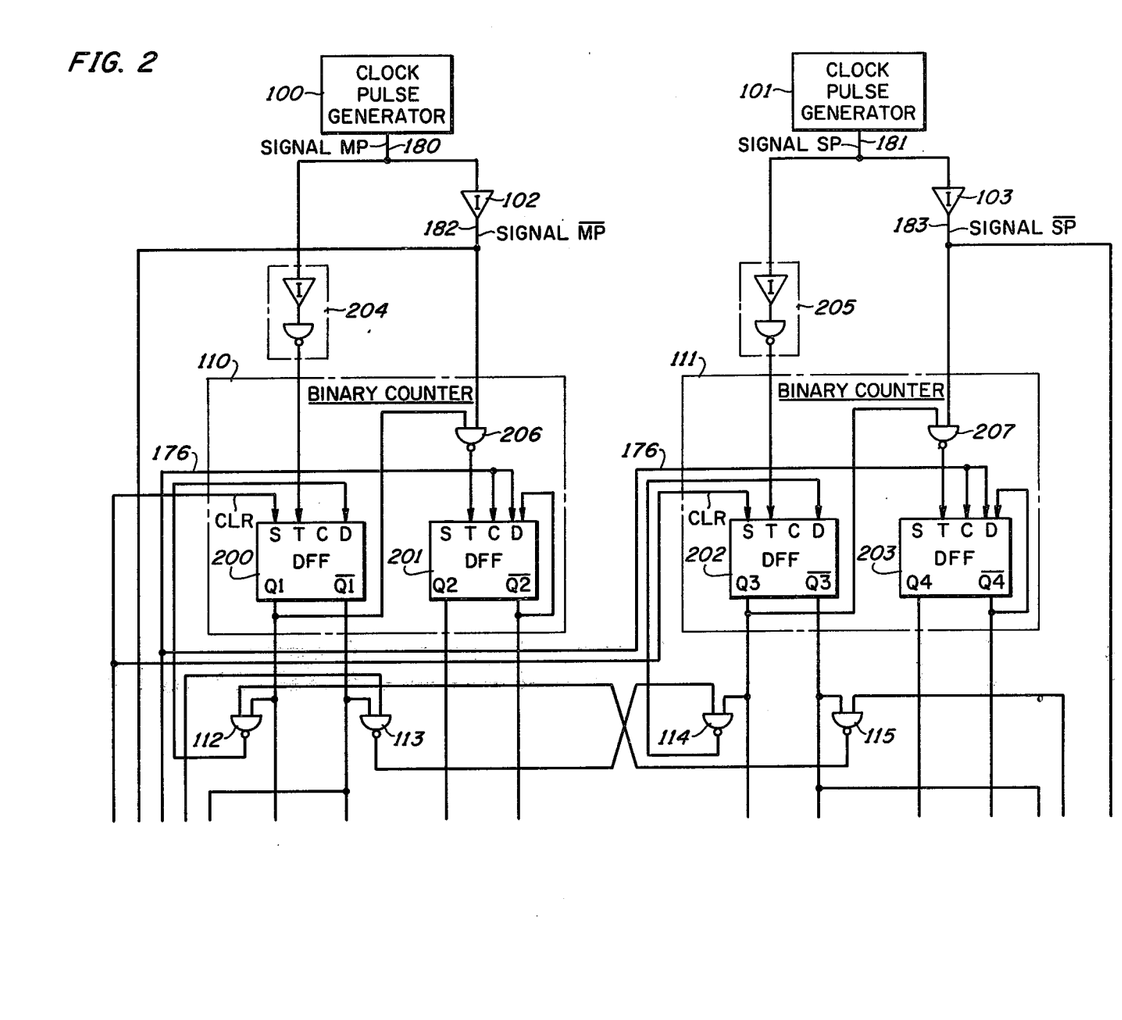
FIGS. 2 and 3 together show a detailed schematic diagram of the active-standby clock pulse circuit arrangement of FIG. 1 in accordance with the invention.
Figure 3:
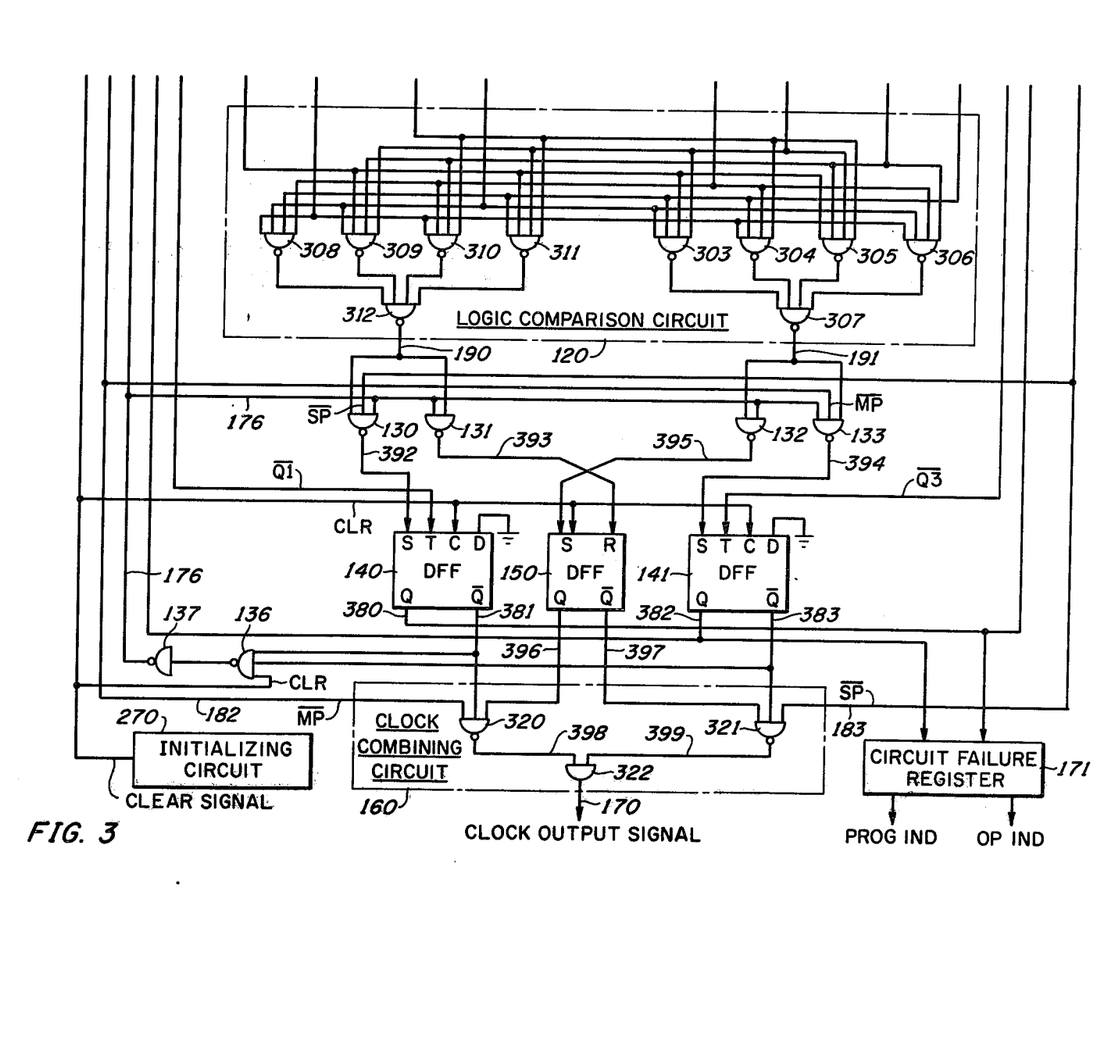

FIGS. 2 and 3 are detailed schematic diagrams of the illustrative embodiment shown in FIG. 1. The description of the circuit can best be accomplished by utilizing FIGS. 2 and 3 in conjunction with the timing diagram of FIG. 6 showing circuit operation when a phase shift occurs between signals MP and SP, the repetitive output signals of clock pulse generators 100 and 101, respectively.

Figure 6:
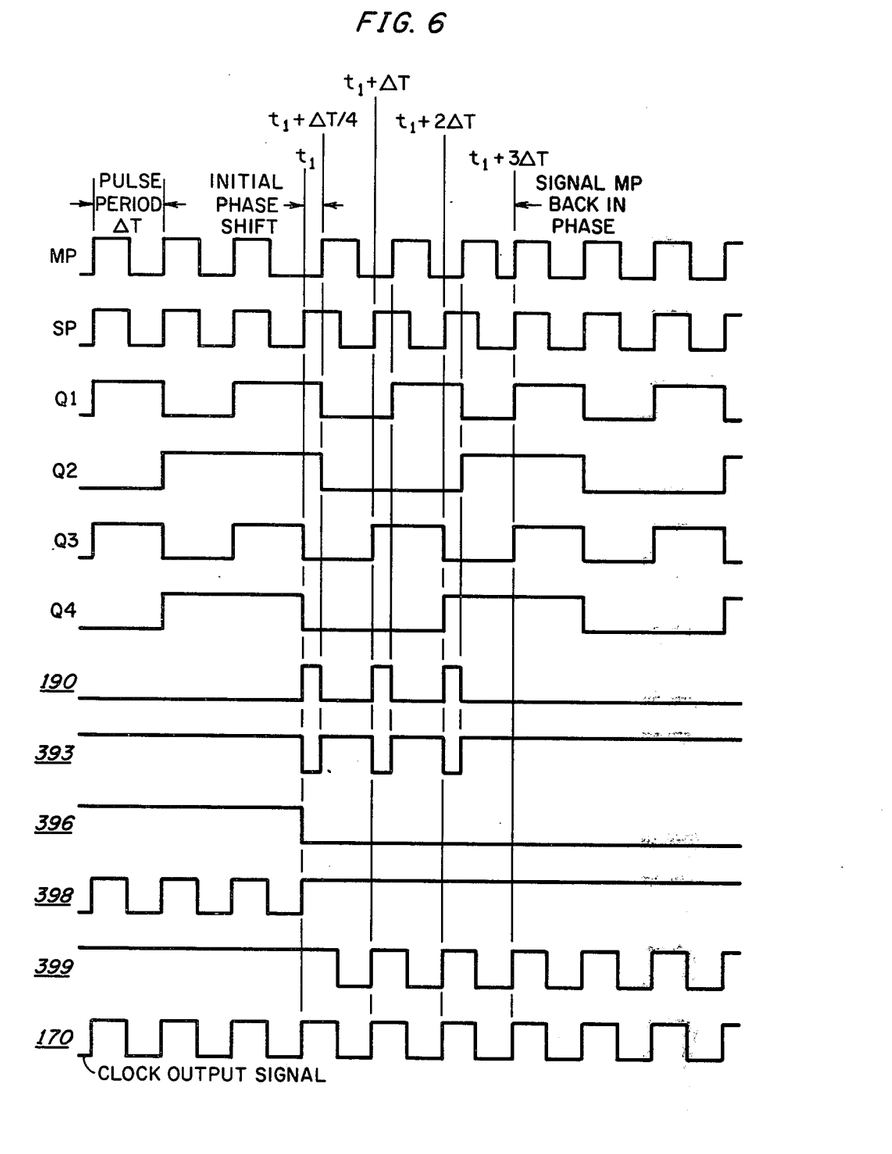
FIGS. 6 and 7 are timing diagrams showing certain of the operations of the circuits of FIGS. 2 through 5.

The repetitive signals MP and SP as shown in FIG. 6, each have a normal pulse period of duration $\Delta T$ and are applied to conductors 180 and 181, respectively. For purpose of description, it is assumed that the illustrative embodiment of the invention shown in FIGS. 2 and 3 is initially in a steady state condition such that the clock output signal on conductor 170 corresponds to repetitive signal MP, i.e., generator 100 is initially the active clock pulse generator while generator 101 is initially the standby clock pulse generator. An initializing circuit 270 shown in FIG. 3 may be utilized to initialize the circuit to this state by providing a "CLEAR" signal to various circuitry as shown in FIGS. 2 and 3.

As shown in FIG. 2, the complement of signal MP, designated $\overline{MP}$, is applied to conductor 182 and is derived through inverter 102. Similarly, the complement of signal SP, designated $\overline{SP}$, is applied to conductor 183 and is derived through inverter 103. Signals MP and $\overline{MP}$ are applied to binary counter 110, while signals SP and $\overline{SP}$ are applied to binary counter 111. Binary counters 110 and 111 are identical and each is a two-binary digit counting circuit comprising two identical "D" type flip-flops shown as flip-flops 200 and 201 of binary counter 110 and flip-flops 202 and 203 of binary counter 111.

Each flip-flop 200 through 203 has a "D" input terminal (D), a trigger input terminal (T), an asynchronous "CLEAR" input terminal (C), two output terminals (Q and $\overline{Q}$), each of which is the complement of the other, and an asynchronous "SET" input terminal (S). For purpose of description of the operation of these flip-flops 200 through 203, and for subsequent description of the operation of the illustrative embodiments of the present invention shown in FIGS. 2 through 5, a voltage representative of a binary "1" will be termed a "high" signal and a voltage representative of a binary "0" will be termed a "low" signal. A low signal at the S input terminal will unconditionally cause the signal at the corresponding Q output terminal to be in a high state and, accordingly, the signal at the $\overline{Q}$ output terminal to be in a low state. Similarly, a low signal at the C input terminal will unconditionally cause the signal at the corresponding Q output terminal to be in a low state and, accordingly, the signal at the $\overline{Q}$ output terminal to be in a high state. A high signal at both the S and C input terminals will allow the flip-flop to be "enabled" and output signals at terminals Q and $\overline{Q}$ will be dependent on input signals at the D and T input terminals. With the S and C input terminals having signals in a high state, the leading edge of a low-to-high state transition pulse at the T input terminal will cause the signal appearing at that time at the D input terminal to be gated to the Q output terminal. By example, if the D input terminal has a signal in the "1" state, a "0" to "1" transition occurring at the T input terminal will cause a "1" to appear at the Q output terminal and, accordingly, a "0" to appear at the $\overline{Q}$ output terminal. Similarly, if the D input terminal has a signal in the "0" state, a "0" to "1" transition occurring at the T input terminal will cause a "0" to appear at the Q output terminal and, accordingly, a "1" to appear at the $\overline{Q}$ output terminal. Negative going transitions, i.e., high-to-low transitions, at the T input terminal will have no effect on the output signals appearing at the Q and $\overline{Q}$ output terminals. When a flip-flop has a high signal appearing at its respective Q output terminal, it is said to be in a "SET" state. When a low signal appears at its respective Q output terminal, it is said to be in a "RESET" state. If a low signal is present at either the S or C input terminals, then pulses appearing at the D or T input terminals will have no effect on signals appearing at the Q and $\overline{Q}$ output terminals.

FIG. 6 is a timing diagram of the circuit operation of the illustrative embodiment according to the invention shown in FIGS. 2 and 3 when signal MP exhibits a phase drift of a duration of approximately $\Delta T/4$ at $t_1$. For purpose of description, propagation delays of the circuit elements in FIGS. 2 and 3 will be ignored since commercially available "D" type flip-flops and logic gates having inconsequential propagation delays at standard clock frequencies (such as 16.384 MHz) may be utilized. As shown in FIG. 2, signal MP on conductor 180 is applied to the T input terminal of flip-flop 200 of binary counter 110 through delay circuit 204, while signal SP on conductor 181 is applied to the T input terminal of flip-flop 202 of binary counter 111 through delay circuit 205. Similarly, signal $\overline{MP}$ on conductor 182 is applied to the T input terminal of flip-flop 201 of binary counter 110 through gate circuit 206 while signal $\overline{SP}$ on conductor 183 is applied to the T input terminal of flip-flop 203 of binary counter 111 through gate circuit 207. Delay circuits 204 and 205 are utilized to ensure that each repetitive clock signal and its associated complementary signal will trigger their respective flip-flops at approximately the same time. The signals at the Q output terminals of flip-flops 200 and 202 (Q1 and Q3 as shown in FIG. 6) represent the least significant digits of binary counters 110 and 111, respectively. These signals are triggered on low-to-high transitions of signals MP and SP, respectively. The signals at the Q output terminals of flip-flops 201 and 203 (Q2 and Q4 as shown in FIG. 6) represent the most significant digits of binary counters 110 and 111, respectively. These signals are triggered on low-to-high transitions of signals MP and SP, respectively, when the signal appearing at the Q output terminal of a flip-flop representing the corresponding least significant digit is in a high state. Thus, the output signals appearing at the Q output terminals of each of the binary counters 110 and 111 represent a two-binary digit counting value. When both signals MP and SP are substantially in phase and operable, the binary counting values will be equal.

As shown in FIGS. 2 and 3, logic comparison circuit 120, comprising NAND gates 303 through 312, compares the signals representing each of the binary counting values and generates an inequality signal on either conductor 190 or 191 if the values are not substantially equal. Each of gates 303 through 306 and 308 through 311 has as input signals, either the Q or $\overline{Q}$ output signal of each of flip-flops 200 through 203. The output signals of gates 308 through 311 are combined in gate 312 to produce a high signal on conductor 190 when counter 111 has a greater counting value than counter 110. The high signal is indicative of a failure of clock pulse generator 100 or of a "lagging" phase drift (defined as a time delay of a pulse of one clock pulse generator relative to the occurrence of a corresponding pulse of the other clock pulse generator) of signal MP. Similarly, the output signals of gates 303 through 306 are combined in gate 307 to produce a high signal on conductor 191 when counter 110 has a greater counting value than counter 111, indicative of a failure of clock pulse generator 101 or of a lagging phase drift of signal SP.

The phase drift phenomenon is distinguished from a failure condition by the period of time that the inequality of the counting values is existent. Subsequent discussion herein will show that the illustrative embodiments of FIGS. 2 through 5 utilize a threshold time period of approximately $\Delta T/2$ for distinguishing a phase drift from a clock circuit failure.

By way of example, the timing diagram of FIG. 6 illustrates the effect of a lagging phase drift of signal MP by a time period of approximately $\Delta T/4$. The phase drift is shown to occur at time $t_1$ and continue until time $t_1 + 3\Delta T$. This example will be discussed with respect to the circuit of FIGS. 2 and 3. A failure condition will be discussed later herein with reference to FIGS. 4, 5, and 7. The low-to-high transition of signal SP at time $t_1$ will increment the binary counting value of counter 111 as represented by the signals appearing at the Q3 and Q4 output terminals of flip-flops 202 and 203, respectively, as shown in FIG. 6. The binary counting value of counter 110, as represented by signals at the Q1 and Q2 output terminals or respective flip-flops 200 and 201, is not incremented at time $t_1$ since signal MP experiences a phase drift and no low-to-high transition occurs at that time. Thus, counters 110 and 111 have unequal counting values.

Gate circuits 303 through 312 of comparison circuit 120 shown in FIG. 3, will detect the inequality of the binary counting values. Since the binary counting value of counter 110 was not incremented at time $t_1$, comparison circuit 120 will detect that binary counter 111 is "ahead" of counter 110. Accordingly, as shown in FIG. 6, a high signal will be generated at time $t_1$ on conductor 190 at the output terminal of gate 312.

The signal on conductor 190 is applied to both gates 130 and 131. Gates 130 and 131 also have the signal on conductor 176 as an input signal. However, as stated in previous discussion regarding the block diagram of FIG. 1, the signal on conductor 176 is an inhibiting signal resultant of either flip-flop 140 or 141 being in a "SET" state, indicative of a clock circuit failure. Flip-flops 140 and 141 are commercially available "D" type circuits identical to flip-flops 200 through 203 shown in FIG. 2 and described in previous discussion. At and preceding time $t_1$, both flip-flops 140 and 141 are in a "RESET" state with the resultant signals at the respective $\overline{Q}$ output terminals being in a high state. Thus, at time $t_1$, the signal on conductor 176 is in a high state and the high signal on conductor 190 is inverted through gate 131 and applied to flip-flop 150 via the signal shown in FIG. 6 on conductor 393. Flip-flop 150 may be a commercially available "S-R" flip-flop, comprising an asynchronous "SET" input terminal (S), an asynchronous "RESET" input terminal (R), and two output terminals (Q and $\overline{Q}$), each of which is the complement of the other. A low signal at the S input terminal will unconditionally cause the signal at the corresponding Q output terminal to be in a high state and, accordingly, the signal at the $\overline{Q}$ output terminal to be in a low state. Similarly, a low signal at the R input terminal will unconditionally cause the signal at the corresponding Q output terminal to be in a low state and, accordingly, the signal at the $\overline{Q}$ output terminal to be in a high state.

As previously stated, flip-flop 150 and clock combining logic circuit 160 shown in FIG. 3 are assumed to be in states such that the clock output signal on conductor 170 corresponds to repetitive signal MP, i.e., clock pulse generator 100 is initially the active clock pulse generator while generator 101 is initially the standby clock pulse generator. Clock combining logic circuit 160 comprises two NAND gates 320 and 321. Gate 320 has input terminals connected to the Q output terminal of flip-flop 150 via conductor 396, the $\overline{Q}$ output terminal of flip-flop 140 via conductor 381, and conductor 182 to which signal $\overline{MP}$ has been applied. Gate 321 has input terminals to the $\overline{Q}$ output terminal of flip-flop 150 via conductor 397, the $\overline{Q}$ output terminal of flip-flop 141 via conductor 383, and conductor 183 to which signal $\overline{SP}$ has been applied. The output terminals of gate 320 and 321 are connected to AND gate 322 via conductors 398 and 399, respectively. The signal generated by gate 322 is the clock output signal and is applied to conductor 170.

For clock pulse generator 100 to be the active generator, flip-flop 150 must be in the "SET" state, thus having a high signal at its Q output terminal and a low signal at its corresponding $\overline{Q}$ output terminal. With the output signal shown in FIG. 6 on conductor 396 at the Q output terminal of flip-flop 150 initially being in a high state, and the output signal on conductor 381 at the $\overline{Q}$ output terminal of flip-flop 140 also being in a high state (this being the "RESET" state of flip-flop 140), gate 320 is enabled to invert signal $\overline{MP}$ on conductor 182, and thus generate a signal on conductor 398 corresponding to signal MP as shown in FIG. 6. With flip-flop 150 being "SET", the signal on conductor 397 at the $\overline{Q}$ output terminal is in a low state thereby disabling gate 321, i.e., the output signal of gate 321 on conductor 399 is in a high state and is independent of signals on conductors 383 and 183. With the signal on conductor 398 corresponding to signal MP, and the signal on conductor 399 being in a high state, the resultant output signal of gate 322 on conductor 170 is a clock output signal corresponding to signal MP as shown in FIG. 6.

With the signal on conductor 393 being in a low state at time $t_1$ and applied to the R input terminal of flip-flop 150, the flip-flop "switches" to the "RESET" state. As shown in FIG. 6, the resultant signal at the Q output terminal on conductor 396 goes to a low state, thus disabling gate 320. Subsequently, signal $\overline{MP}$ on conductor 182 is "blocked" by gate 320 and the signal on conductor 398 now goes to a high state as shown in FIG. 6. With flip-flop 150 being "RESET", the signal on conductor 397 also goes to a high state and gate 321 is enabled to invert signal $\overline{SP}$ on conductor 183 and thus generate a signal on conductor 399 shown in FIG. 6 corresponding to signal SP. Accordingly, subsequent to time $t_1$, the resultant output signal of gate 322 on conductor 170 is a clock output signal corresponding to signal SP. As shown in FIG. 6, though a lagging phase drift of signal MP of the initially active clock pulse generator 100 has occurred, the phase drift does not appear in the clock output signal appearing on conductor 170.

As previously stated, the high signal on conductor 190 at time $t_1$ is also applied to gate 130. The output signal of gate 130 on conductor 392 is applied to the S input terminal of flip-flop 140. If the signal on conductor 392 goes to a low state, flip-flop 140 is "SET", indicative of a failure of clock pulse generator 100. However, it is a feature of this invention to allow substantial phase shift between the repetitive signals of clock pulse generators 100 and 101 without false indication of a clock circuit failure. It is advantageous to allow phase shifting without false failure indications because clock pulse generators which operate independently in an electronic processing system may exhibit harmless phase drift due to external environmental conditions.

By example, the substantial phase shift allowance for this invention is accomplished in the illustrative embodiment shown in FIGS. 2 and 3 by utilization of signal $\overline{SP}$ on conductor 183 as an input signal to gate 130. Though the signal on conductor 190 goes to a high state at time $t_1$, signal $\overline{SP}$ will disable gate 130 from time $t_1$ to $t_1 + \Delta T/2$, i.e., the period of time during which signal $\overline{SP}$ is in a low state. If signal MP goes to a high state, thus incrementing the binary counting value of counter 110, before the occurrence of the low-to-high transition pulse of signal SP at time $t_1 + \Delta T$, the binary counting values of counters 110 and 111 will be equal. Comparison circuit 120 will then detect this equality and the signal on conductor 190 will go to a low state. Gate 130 will generate a low signal on conductor 392 if both signal $\overline{SP}$ and the signal on conductor 190 are simultaneously in high states. Therefore, if signal MP goes to a high state before time $t_1 + \Delta T/2$, indicating a phase drift of less than a $\Delta T/2$ duration, a low signal will not appear on conductor 392. Utilizing the timing diagram of FIG. 6, it is shown that flip-flop 140 will not be "SET" since signal MP goes to a high state at time $t_1 + \Delta T/4$. It is noted that a greater allowance of phase shift differential may be accomplished by adding delay circuitry to the conductor on which signal $\overline{SP}$ is applied to gate 130.

It is an advantage of the invention that continuous alternating of the active-standby statuses of the clock pulse generators will not occur when a phase drift continues for a substantial duration. By example, FIG. 6 shows signal MP continuing its lagging phase drift for a duration of three pulse periods. At each of times $t_1 + \Delta T$ and $t_1 + 2\Delta T$, comparison circuit 120 will detect inequality between the binary counting values of counters 110 and 111 and will generate a high signal on conductor 190. However, the resultant low signal on conductor 393 is applied to the R input terminal of flip-flop 150 which was "RESET" at time $t_1$. Thus, the states of flip-flop 150 and clock combining logic circuit 160 remain constant. It is further noted that at time $t_1 + 3\Delta T$, when signal MP returns in phase, no change of state occurs in the aforementioned circuitry. From time $t_1$ until a failure or a phase drift of signal SP occurs, generator 101 remains the active clock pulse generator.

Operation of the illustrative embodiment shown in FIGS. 2 and 3 upon a lagging phase drift of signal MP is analogous to phase drifting of signal SP as can be seen from the symmetry of the clock circuit arrangement of the invention.

Figure 4:
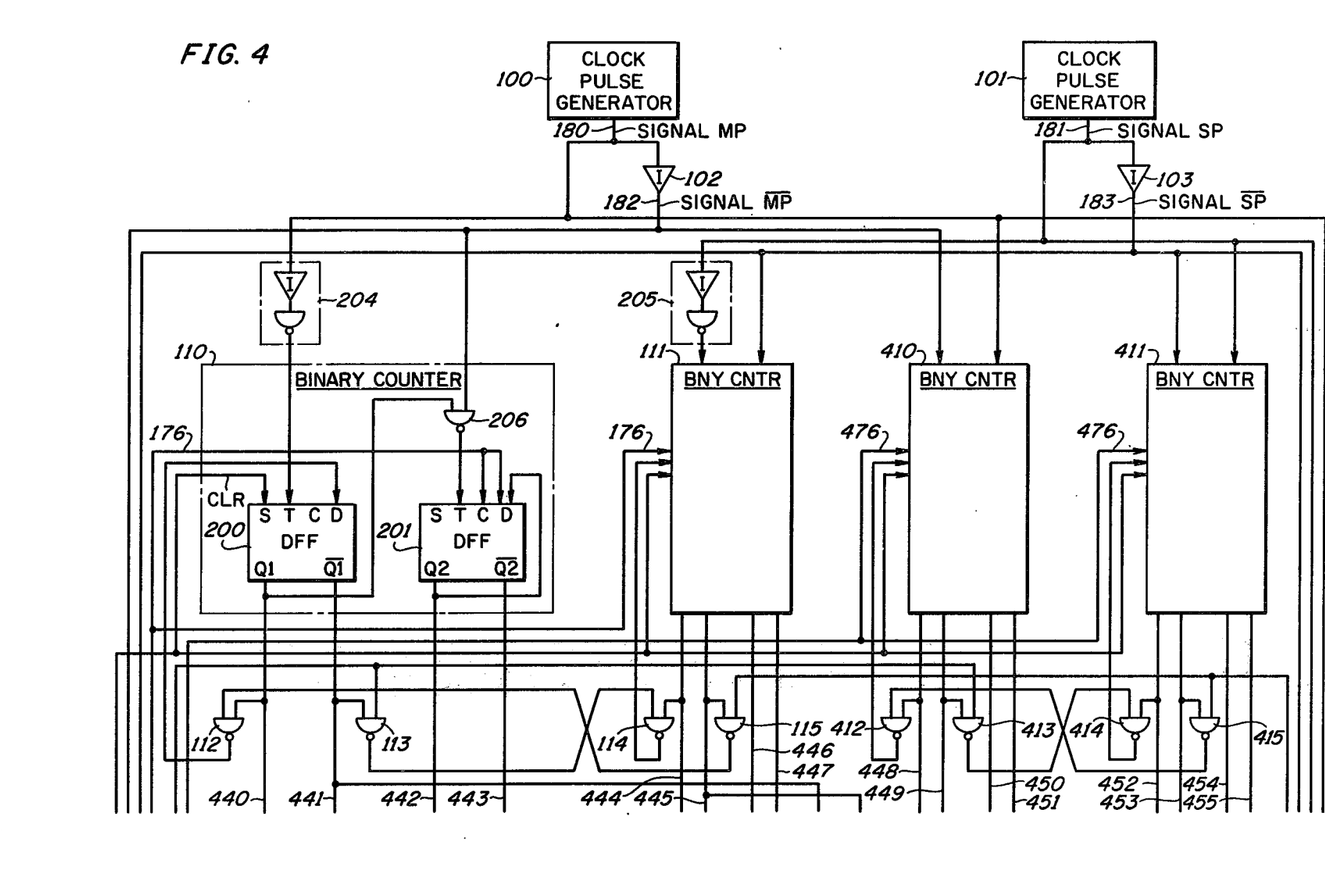
FIGS. 4 and 5 together show a detailed schematic diagram of a second illustrative embodiment of the active-standby clock pulse circuit arrangement in accordance with the invention.
Figure 5:
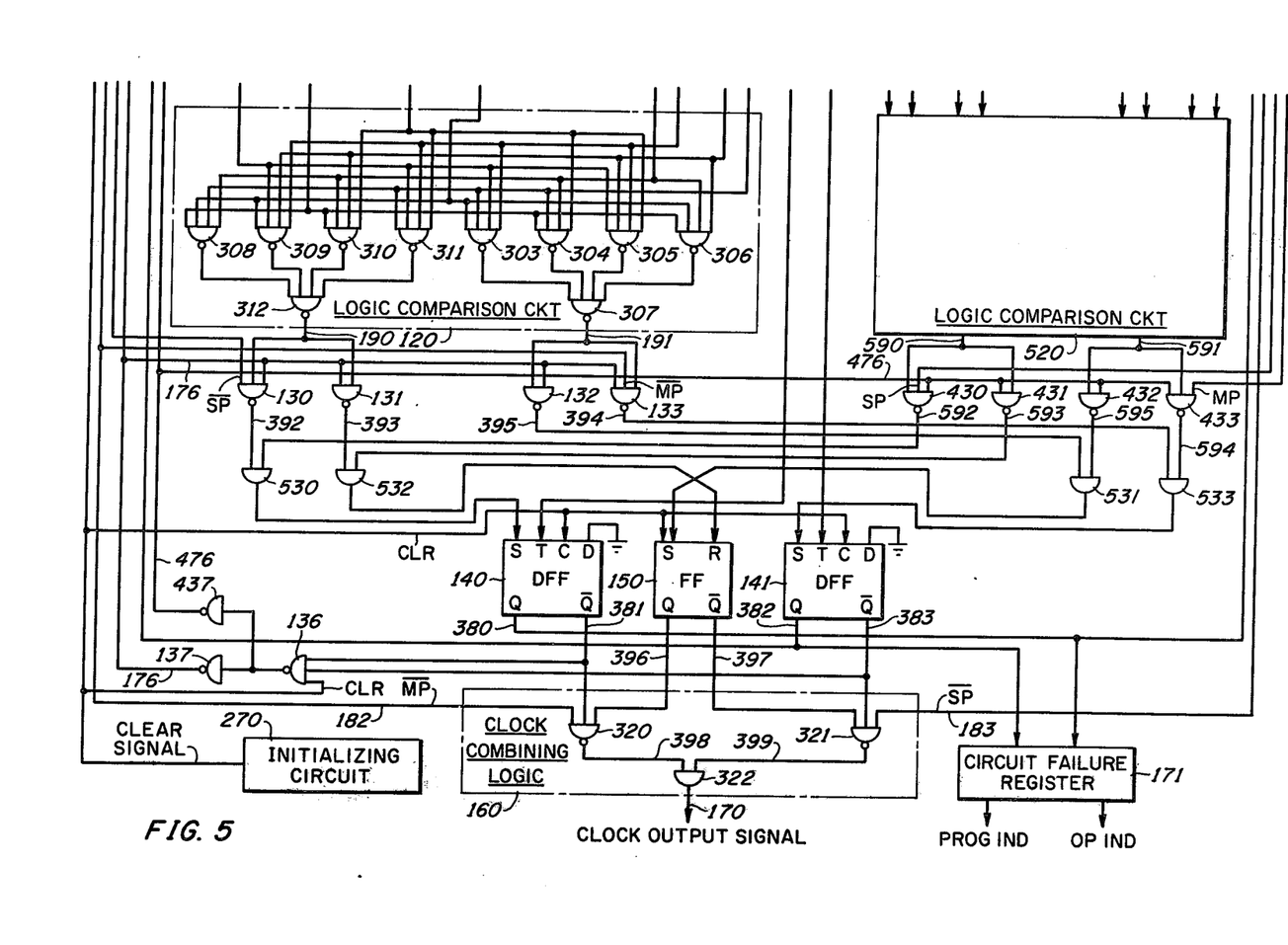

A second illustrative embodiment of a clock pulse circuit according to the invention is shown in FIGS. 4 and 5. The embodiment of FIGS. 4 and 5 includes certain circuit elements shown in FIGS. 2 and 3 and have the same structure and function as previously described herein. Additionally, the circuit of FIGS. 4 and 5 comprises two binary-digit counters 410 and 411, a logic comparison circuit 520, and various logic circuitry subsequently described herein. Counters 410 and 411 are identical in structure to counters 110 and 111. Similarly, comparison circuit 520 is identical in structure to comparison circuit 120. For drawing simplicity, the circuit structures of counters 111, 410, 411, and comparison circuit 520 are not shown in FIGS. 4 and 5.

Figure 7:
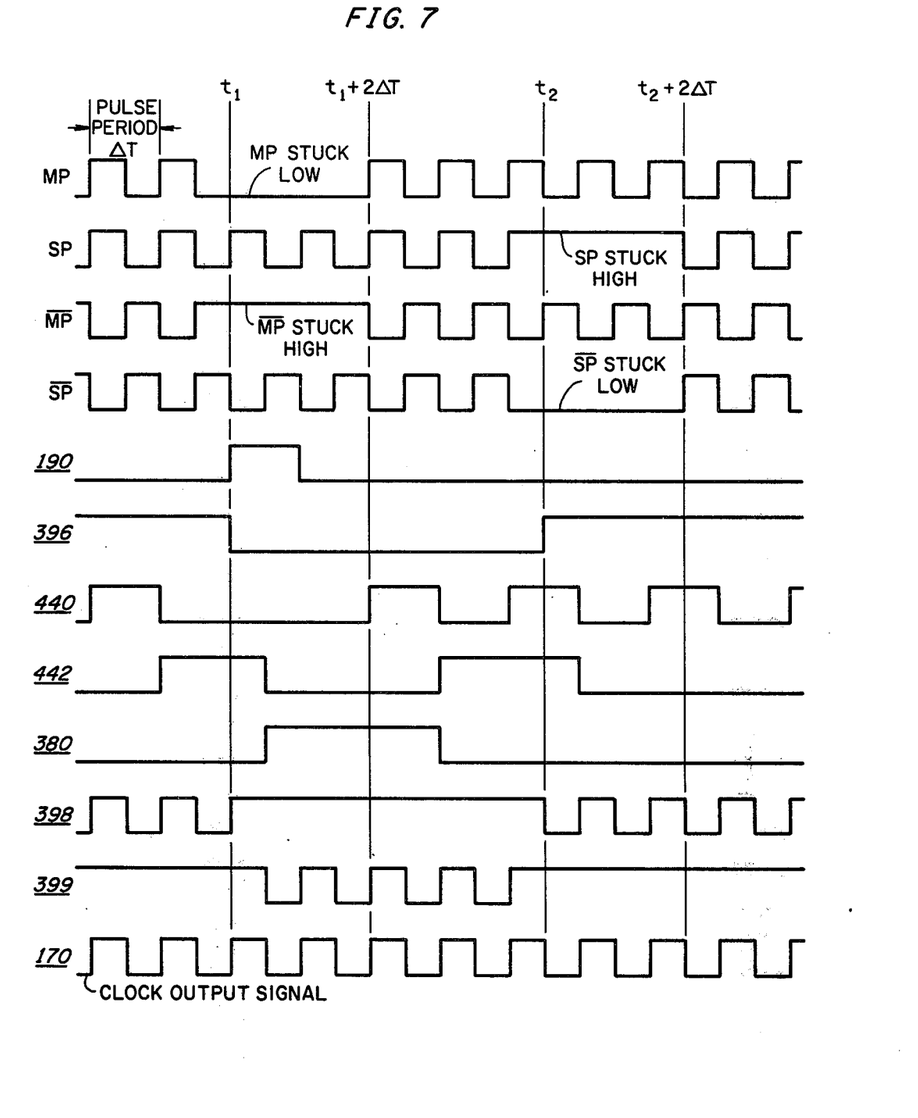

The illustrative embodiment shown in FIGS. 4 and 5 exemplifies a feature of the invention to maintain, in a duplicated clock circuit arrangement, an uninterrupted sequence of clock output pulses regardless of a failure of a clock pulse generator and regardless of whether the failed clock pulse generator is stuck in a high state or a low state. FIG. 7 is a timing diagram which illustrates circuit operation of the embodiment when clock pulse generator 100 is initially the active clock pulse generator and signal MP becomes stuck in a low state at time $t_1$. Also shown in FIG. 7 is circuit operation when clock pulse generator 101 is the active clock pulse generator and signal SP becomes stuck in a high state at time $t_2$. In both instances of clock circuit failure, the clock output signal on conductor 170 maintains an uninterrupted sequence of clock output pulses.

As with the embodiment of FIGS. 2 and 3, it is assumed that the illustrative embodiment of the invention shown in FIGS. 4 and 5 is initially in a steady state condition with clock pulse generator 100 being the active clock pulse generator such that the clock output signal on conductor 170 corresponds to signal MP. In addition to binary counters 110 and 111 counting repetitive pulses of respective signals MP and SP, counters 410 and 411 as shown in FIG. 4 are utilized to count repetitive pulses of signals derived from signals MP and SP, respectively. These derived signals, designated $\overline{MP}$ and $\overline{SP}$, are the logical complements of signals MP and SP, respectively. Output signals on conductors 448 and 452 represent the least significant digits of the binary counting values of counters 410 and 411, respectively. These signals are triggered on low-to-high transition pulses of signals $\overline{MP}$ and $\overline{SP}$, respectively. The output signals on conductors 450 and 454 represent the most significant digits of counters 410 and 411, respectively. These signals are triggered on low-to-high transition pulses of signals $\overline{MP}$ and $\overline{SP}$, respectively, when the signal representing the corresponding least significant digit is in a high state. When both signals $\overline{MP}$ and $\overline{SP}$ are substantially in phase and operable, the binary counting values of counters 410 and 411 will be equal.

Logic comparison circuit 520 compares the signals representing the binary counting values of counters 410 and 411. A high signal is generated on conductor 590 when counter 411 has a greater counting value than counter 410, indicative of a failure of clock pulse generator 100 or of a lagging phase drift of signal $\overline{MP}$. Similarly, a high signal is generated on conductor 591 when counter 410 has a greater counting value than counter 411, indicative of a failure of clock pulse generator 101 or a lagging phase drift of signal $\overline{SP}$.

Subsequent discussion herein will show that the utilization of the four binary counters 110, 111, 410, and 411, each responsive to clock pulse generator signal MP or SP, or to a complemented signal $\overline{MP}$ or $\overline{SP}$, enables the clock circuit arrangement to detect a failure condition immediately upon the next transition pulse of the operating clock generator signal. Advantageously, this failure detection is not delayed until the next occurrence of a specifically low-to-high transition of the operating clock generator signal.

By way of example, the timing diagram of FIG. 7 first illustrates the effect of signal MP becoming stuck in a low state at time $t_1$, and remaining in that state until time $t_1 + 2\Delta T$, where $\Delta T$ is the pulse period of signals MP and SP. The low-to-high transition pulse of signal SP at time $t_1$ will increment the binary counting value of counter 111 while counter 110 remains in its prior state. Logic comparison circuit 120 will detect the inequality of the binary counting values. Accordingly, as shown in FIG. 7, a high signal will be generated at time $t_1$ on conductor 190, indicative of an inequality between counters 110 and 111.

The high signal on conductor 190 is applied to both gates 130 and 131 as shown in FIG. 5. As previously described with respect to FIG. 2 and 3, the signal on conductor 176 is initially in a high state since both flip-flops 140 and 141 are in a "RESET" state. Thus, the high signal on conductor 190 is inverted through gate 131 and applied through gate 532 to flip-flop 150.

As previously described with respect to FIG. 3, the low signal on conductor 393 at time $t_1$ applied through gate 532 resets flip-flop 150, it having been in a "SET" state prior to time $t_1$. The resultant low signal on conductor 396, as indicated in FIG. 7, disables gate 320 and the resultant high signal on conductor 397 enables gate 321. Accordingly, as shown in FIG. 7, the signal on conductor 398 at the output of gate 320 goes to a high state and the signal on conductor 399 at the output of gate 321 corresponds to signal SP subsequent to time $t_1$. The clock output signal shown in FIG. 7 on conductor 170 corresponds to signal MP prior to time $t_1$ and to signal SP subsequent to time $t_1$. It is noted that the failure of signal MP is not reflected in the clock output signal on conductor 170.

As previously stated, the high signal on conductor 190 is also applied to gate 130 as shown in FIG. 5. In the example depicted in FIG. 7, unlike the example utilized in the timing diagram of FIG. 6, signal MP remains in a failure state for a period of time greater than $\Delta T/2$. At time $t_1 + \Delta T/2$, signal SP at the input of gate 130 goes to a high state, thereby enabling gate 130 to invert the high signal on conductor 190. The resultant low signal at time $t_1 + \Delta T/2$ on conductor 392 is applied through gate 530 to the S input terminal of flip-flop 140 as shown in FIG. 5, thereby setting flip-flop 140 indicating a failure of clock pulse generator 100.

The output signals of flip-flop 140 are utilized for failure indication, gate inhibiting, and counter initialization purposes. When flip-flop 140 is "set" at time $t_1 + \Delta T/2$, the signal at the Q output terminal on conductor 380 goes to a high state as shown in FIG. 7, indicative of a failure of clock pulse generator 100. This signal is first utilized as an input signal to circit failure register 171 shown in FIG. 5. As previously described with respect to FIG. 1, register 171 may be utilized to indicate to an operator or to a computer system that a specific clock circuit failure has occurred. The high failure indication signal on conductor 380 is further utilized to "interlock" the least significant digits of each of the pairs of binary counters 110, 111 and 410, 411. This is done to ensure that upon restoration of the failed clock pulse generator, the least significant digits of the binary counters are in phase. To accomplish the interlock function, the high signal on conductor 380 is utilized as an input to gates 115 and 415, as shown in FIGS. 4 and 5. Gate 115 also has an input the signal on conductor 445 which is the complement of the signal on conductor 444 representing the least significant digit of counter 111. With a high signal on conductor 380, gate 115 is enabled to invert the signal on conductor 445. The output signal of gate 115 is thus substantially identical to the signal on conductor 444 representing the least significant digit of counter 111, and is applied to the input of gate 112. Gate 112 also has as an input the signal on conductor 440 representing the least significant digit of counter 110. The signal at the output of gate 112 is utilized as the signal to the D input terminal of flip-flop 200 as shown in FIG. 4. If signal MP is in a failure state such that the signal on conductor 440 is in a high state, then gate 112 is enabled to invert the output signal of gate 115. Thus, the resultant signal at the D input terminal of flip-flop 200 represents the complement of the least significant digit of counter 111. Upon restoration of failed signal MP, a low-to-high transition pulse of signal MP will trigger flip-flop 200, thereby gating the signal at the D input terminal to the Q1 output terminal which represents the least significant digit of counter 110. However, at the approximate time of the low-to-high transition pulse of signal MP, a low-to-high transition pulse of signal SP also occurs. Thus, the signal on conductor 444 representing the least significant digit of counter 111 changes state and the least significant digits of counter 110 and 111 are in phase and synchronized. By symmetry of the circuit shown in FIG. 4 and 5, gates 415 and 412 have identical function to gates 115 and 112, respectively, for counters 410 and 411. Similarly, gates 113, 114, 413, and 414 are operable to perform the interlocking function when signal SP is in a failure state.

As shown in the example of FIG. 7, with signal MP failing in a low state at time $t_1$, the signal on conductor 440 is stuck in a low state. Gate 112 is therefore disabled and a high signal is applied to the D input terminal of flip-flop 200 as shown in FIG. 4. Upon restoration of signal MP at time $t_1 + 2\Delta T$, the low-to-high transition pulse of signal MP will cause a high signal to be applied to conductor 440, thereby enabling gate 112. The corresponding low-to-high transition pulse of signal SP at time $t_1 + 2\Delta T$ will cause a low signal to be applied to conductor 445 and a high signal will be applied to gate 112 via gate 115. The resultant low output signal of gate 112 is applied to the D input terminal of flip-flop 200. The least significant digits of counters 110 and 111 are thereafter in phase and synchronized. Gates 415 and 412 operate in a similar manner to gates 115 and 112, respectively, to interlock the least significant digits of counters 410 and 411 and ensure synchronization upon restoration of signal MP at time $t_1 + 2\Delta T$.

The signal on conductor 381 at the $\overline{Q}$ output terminal of flip-flop 140 is utilized as a gate inhibiting signal upon failure of signal MP. The low signal at time $t_1 + \Delta T/2$ is applied as an input to disable gate 320 as shown in FIG. 5. Though gate 320 is also disabled by the low signal on conductor 396 since flip-flop 150 is in the "RESET" state, the signal of conductor 381 ensures that gate 320 remains disabled should spurious signals occur at the S or R input terminals of flip-flop 150. As shown in FIG.

5, the signal on conductor 381 is further utilized as an input to gate 136. The low signal on conductor 381 results in a high output signal of gate 136 which is applied to the inputs of gates 137 and 437. The resultant low output signal of gate 137 on conductor 176 is utilized to disable gates 130 through 133. Similarly, the resultant low output signal of gate 437 on conductor 476 is utilized to disable gates 430 through 433. The disabling function is performed to ensure that spurious signals do not affect the outputs of the aforementioned gates and to initialize the gate circuitry for subsequent utilization. The signal on conductor 176 is further applied to the C and D input terminals of the flip-flops whose output signals represent the most significant digits of binary counters 110 and 111, e.g., flip-flop 201 of counter 110 as shown in FIG. 4. Similarly, the signal on conductor 476 is applied to the C and D input terminals of the flip-flops whose output signals represent the most significant digits of binary counters 410 and 411. Accordingly, the signals representing the most significant digits of counters 110, 111, 410, and 411 are initialized to a low state and remain in that state until flip-flop 140 is reset. The initialization ensures that upon restoration of failed signal MP, the most significant digits of the binary counters will be in phase.

As shown in FIG. 7, signal MP is restored at time $t_1 + 2\Delta T$. With conductor 441 connected to the T input terminal of flip-flop 140 and the D input terminal of flip-flop 140 connected to ground, a low-to-high transition pulse of the signal on conductor 441, representing the complement of the least significant digit of counter 110, triggers flip-flop 140 to go to the "RESET" state, indicative of restoration of failed signal MP. The aforementioned gate disabling and interlocking functions of the output signals of flip-flop 140 then cease. The resultant low signal at the Q output terminal of flip-flop 140 on conductor 380 shown in FIG. 7 is applied to circuit failure register 171 and is indicative of signal MP again being in an operating state. It should be noted that the clock output signal on conductor 170 continues to correspond to signal SP through signal MP has been restored.

As shown in the timing diagram of FIG. 7, signal SP fails in a high state at time $t_2$. With a clock pulse generator signal stuck in a high state, the advantageous utilization of counters 410 and 411 is exemplified. If only counters 110 and 111 were utilized, the failure condition of signal SP at time $t_2$ would not be detected until a subsequent low-to-high transition pulse of signal MP at time $t_2 + \Delta T/2$. However, with counters 410 and 411 being responsive to count repetitive pulses of signals $\overline{MP}$ and $\overline{SP}$, respectively, the low-to-high transition pulse of signal $\overline{MP}$ at time $t_2$ will cause an immediate inequality of the corresponding binary counting values. Logic comparison circuit 520 shown in FIG. 5 detects this inequality and generates a high signal on conductor 591 indicative of signal $\overline{SP}$, and thus signal SP, being in a failure state. Thereafter the operation of the embodiment shown in FIGS. 4 and 5 is similar to that previously described when signal MP failed at time $t_1$ with flip-flop 141 being "SET" instead of flip-flop 140. The inequality indication in the form of a high signal on conductor 591 is applied to the input gate 432. The resultant low output signal on conductor 595 is applied through gate 531 to the S input terminal of flip-flop 150. Flip-flop 150 thereby goes to a "SET" state and the resultant output signals enable gate 320 and disable gate 321. Accordingly, subsequent to time $t_2$, pulses of the clock output signal shown in FIG. 7 on conductor 170 will thus correspond to the repetitive signal MP. The high signal on conductor 591 is further applied to the input of gate 433 as shown in FIG. 5. When signal MP goes to a high state at time $t_2 + \Delta T/2$ as shown in FIG. 7, a low signal will be generated at the output of gate 433 on conductor 594. This low signal will be applied through gate 533 to the S input terminal of flip-flop 141. Accordingly, flip-flop 141 will go to a "SET" state, indicative of a failure of signal SP.

Upon the failure of signal SP setting flip-flop 141, the output signals of flip-flop 141 are utilized in a manner similar to that of the output signals of flip-flop 140 when signal MP is in a failure state. The high signal occuring on conductor 382 at the Q output terminal of flip-flop 141 is applied to circuit failure register 171 for external indication of the failure of signal SP. The high signal on conductor 382 is further applied as an input to gates 113 and 413 as shown in FIG. 4 for the purpose of interlocking least significant digits of the binary counters 110, 111, 410, 411 as previously described with respect to a failure of signal MP. The low signal occurring on conductor 383 at the $\overline{Q}$ output terminal of flip-flop 141 when it is in the "SET" state, is applied to gate 321 as shown in FIG. 5. Gate 321 is thereby inhibited from inverting signal $\overline{SP}$ and applying the resultant signal to conductor 399 should spurious signals reset flip-flop 150. The signal on conductor 383 is further applied to gate 326, as shown in FIG. 5. The output signal of gate 326 is applied to both gates 137 and 437. The resultant low output signals on conductors 176 and 476 are utilized to inhibit gates 130 through 133 and 430 through 433, respectively. These signals are further utilized to initialize the most significant digits of counters 110, 111, 410, and 411 as previously described with respect to a failure of signal MP.

As shown in FIG. 7, signal SP is restored at time $t_2 + 2\Delta T$. Flip-flop 150 remains in a "SET" state and the clock output signal on conductor 170 continues to correspond to repetitive pulses of signal MP. Flip-flop 141 is reset by the first low-to-high transition pulse on conductor 445 following the restoration of signal SP. All gate inhibiting functions previously described thereby cease and the embodiment of FIGS. 4 and 5 is again operable to detect subsequent clock pulse generator failures.

By symmetry of the embodiment shown in FIG. 4 and 5, it will be apparent to those skilled in the art that the circuit operates with similar function as previously described when signal MP fails in a high state or signal SP fails in a low state.

It should be noted that the flip-flops 140 and 141 of the embodiment shown in FIGS. 4 and 5 are operable not only to indicate a failure of a clock pulse generator, but may also be utilized to indicate a malfunction in a binary counter or other associated circuitry. Circuits similar to that shown in FIGS. 4 and 5 may be constructed on single integrated circuit chips such that regardless of which element in the circuit fails, the entire chip is replaced. Thus, it is advantageous to have failure indication of both a clock generator and associated circuitry.

It will be apparent to those skilled in the art that modifications and variations of the above-described illustrative embodiments of the invention may be effected without departing from the spirit and scope of the novel concepts of the present invention.

I claim:

1. An active-standby clock pulse circuit arrangement, having a clock output terminal, for generating a sequence of clock output pulses at said clock output terminal, wherein said circuit arrangement comprises:
   a first clock pulse generator and a second clock pulse generator, each of which generates a sequence of repetitive signal pulses;
   control means for selectively applying to said clock output terminal a sequence of clock output pulses corresponding either to said sequence of repetitive signal pulses generated by said first clock pulse generator or to said sequence of repetitive signal pulses generated by said second clock pulse generator;
   Characterized in that
   said control means further comprises:
   a first counter associated with said first clock pulse generator and a second counter associated with said second clock pulse generator, each adapted to count the pulses of the sequence of repetitive signal pulses generated by the associated clock pulse generator and to provide counting signals indicative of the state of the counter;
   logic circuit means connected to said clock pulse generators and adapted to apply at said clock output terminal a sequence of clock output pulses corresponding to said sequence of repetitive signal pulses of said first clock pulse generator;
   comparison means connected to said first and second counters and to said logic circuit means for comparing said counting signals provided by said first and said second counters and for generating a counter inequality signal when the value represented by counting signals of said second counter is greater than the value represented by counting signals of said first counter;
   said logic circuit means being responsive to said counter inequality signal to inhibit the application of said sequence of clock output pulses corresponding to said sequence of repetitive signal pulses of said first clock pulse generator and to apply at said clock output terminal a sequence of clock output pulses corresponding to said sequence of repetitive signal pulses of said second clock pulse generator.

2. A clock pulse circuit arrangement in accordance with claim 1 characterized in that said comparison means further generates an additional inequality signal when the value represented by counting signals of said first counter is greater than the value represented by counting signals of said second counter, and in that said logic circuit means is responsive to said additional inequality signal to inhibit the application of said sequence of clock output pulses corresponding to said sequence of repetitive signal pulses of said second clock pulse generator and to apply at said clock output terminal a sequence of clock output pulses corresponding to said sequence of repetitive signal pulses of said first clock pulse generator.

3. A clock pulse circuit arrangement in accordance with claim 1 characterized in that said control means comprises a failure indication flip-flop having a "SET" state and a "RESET" state, and gate means responsive to said counter inequality signal and a gating signal to "SET" said failure indication flip-flop only when said counter inequality signal is existent for a predetermined duration of time.

4. A clock pulse circuit arrangement in accordance with claim 3 characterized in that said gating signal comprises an output signal of said second clock pulse generator.

5. A clock pulse circuit arrangement in accordance with claim 1 characterized in that said arrangement comprises circuit means connected to said first and second clock pulse generators for deriving an additional sequence of repetitive signal pulses from each of said sequences of repetitive signal pulses of said first and said second clock pulse generators, respectively, and in that said control means further comprises a third counter associated with said first clock pulse generator and a fourth counter associated with said second clock pulse generator, each of said counters being adapted to count the pulses of said additional sequence of repetitive signal pulses derived from said sequence of repetitive signal pulses of the associated clock pulse generator and to provide counting signals indicative of the state of the counter, and wherein said comparison means is further connected to said third and said fourth counters for comparing said counting signals provided by said third and fourth counters to further generate said counter inequality signal when the value represented by counting signals of said fourth counter is greater than the value represented by counting signals of said third counter.

6. A clock pulse circuit arrangement in accordance with claim 5 characterized in that said comparison means further generates an additional inequality signal when the value represented by counting signals of said first counter is greater than the value represented by counting signals of said second counter and when the value represented by counting signals of said third counter is greater than the value represented by counting signals of said fourth counter and further characterized in that said logic circuit means comprises a bistable circuit which assumes a first stable state in response to said counter inequality signal and to assume a second stable state in response to said additional inequality signal, and further comprises gating circuits responsive to said bistable circuit being in said first stable state to apply said sequence of repetitive signal pulses generated by said second clock pulse generator to said clock output terminal and responsive to said bistable circuit being in said second state to apply said sequence of repetitive signal pulses generated by said first clock pulse generator to said clock output terminal.

7. A clock pulse circuit arrangement in accordance with claim 6 characterized in that said control means comprises first and second failure indication flip-flops each having a "SET" state and a "RESET" state, and gate means responsive to said counter inequality signal and a first gating signal to "SET" said first failure indication flip-flop only when said counter inequality signal is existent for a predetermined duration of time and responsive to said additional inequality signal and a second gating signal to "SET" said second failure indication flip-flop only when said additional inequality signal is existent for a predetermined duration of time and further characterized in that said control means further comprises inhibit circuit means connected to said first and second failure indication flip-flops for inhibiting the generation of said inequality signals when either of said failure indication flip-flops is in the "SET" state.

8. A clock pulse circuit arrangement in accordance with claim 7 characterized in that said first gating signal comprises an output signal of said second clock pulse generator and further characterized in that said second gating signal comprises an output signal of said first clock pulse generator.

9. A clock pulse circuit arrangement in accordance with claim 7 characterized in that said first failure indication flip-flop is responsive to said counting signals of said first and said third counters to change from a "SET" state to a "RESET" state and in that said second failure indication flip-flop is responsive to said counting signals of said second and said fourth counters to change from a "SET" state to a "RESET" state.

10. A clock pulse circuit arrangement in accordance with claim 7 characterized in that each of said counters comprises a binary counter having a plurality of digits including at least significant digit and wherein said inhibit circuit means comprises gate circuits connected to said binary counters to "RESET" all digits except said least significant digits of all of said binary counters when either of said failure indication flip-flops is in the "SET" state.

11. A clock pulse circuit arrangement in accordance with claim 9 characterized in that said counting signals of each of said counters comprise a least significant digit signal and further characterized in that said clock pulse circuit arrangement comprises gating circuits connected to said failure indication flip-flops and to said counters for interconnecting said first counter to said second counter and said third counter to said fourth counter when either of said failure indication flip-flops is in a "SET" state and for synchronizing said least significant digit signals of said first and second counters and said third and fourth counters when either of said failure indication flip-flops changes from a "SET" state to a "RESET" state.

12. A clock pulse circuit arrangement comprising a first clock pulse generator and a second clock pulse generator, each of which generates a sequence of repetitive signal pulses, and control means for selectively generating a failure indication signal;

Characterized in that
said control means further comprises:
comparison means connected to said first and second clock pulse generators for comparing said sequences of repetitive pulses and for generating an inequality signal indicative of a lagging phase drift of said sequence of repetitive signal pulses of said first clock pulse generator relative to said sequence of repetitive signal pulses of said second clock pulse generator;
gating means connected to said comparison means and to said second clock pulse generator and responsive to said inequality signal and a gating signal for inhibiting generation of a failure indication signal when said lagging phase drift is of a duration of time less than a predetermined duration of time and for generating a failure indication signal when said lagging phase drift is of a duration of time greater than said predetermined duration of time.

13. A clock pulse circuit arrangement in accordance with claim 12 characterized in that said gating signal comprises an output signal of said second clock pulse generator.

14. An active-standby clock pulse circuit arrangement, having a clock output terminal, for generating a sequence of clock output pulses at said clock output terminal, and comprising:
a first clock pulse generator for generating a first sequence of repetitive signal pulses and a second clock pulse generator for generating a second sequence of repetitive signal pulses; and
control means for selectively applying to said clock output terminal a sequence of clock output pulses corresponding either to said first or to said second sequence of repetitive signal pulses;

Characterized in that
said control means further comprises:
circuit means connected to said first and second clock pulse generators for deriving a first complementary sequence of repetitive signal pulses which is the logical inverse of said first sequence of repetitive signal pulses, and for deriving a second complementary sequence of repetitive signal pulses which is the logical inverse of said second sequence of repetitive signal pulses;
a first counter connected to said first clock pulse generator and a second counter connected to said second clock pulse generator, wherein said first and second counters are adapted to count pulses of said first and said second sequences of repetitive signal pulses, respectively, and to generate first and second sets of counting signals indicative of the state of the first and second counter, respectively;
third and fourth counters connected to said circuit means adapted to count pulses of said first and said second complementary sequences of repetitive signal pulses, respectively, and to generate third and fourth sets of counting signals indicative of the state of the third and fourth counters, respectively;
first comparison means connected to said first and second counters for comparing said first and said second sets of counting signals and for generating a first inequality signal when the value represented by said second set of counting signals is greater than the value represented by said first set of counting signals indicative of said first clock pulse generator being in an apparent failure state, and for further generating a second inequality signal when the value represented by said first set of counting signals is greater than the value represented by said second set of counting signals indicative of said second clock pulse generator being in an apparent failure state;
second comparison means connected to said third and fourth counters for comparing said third and fourth sets of counting signals and for generating a third inequality signal when the value represented by said fourth set of counting signals is greater than the value represented by said third set of counting signals indicative of said first clock pulse generator being in an apparent failure state and for further generating a fourth inequality signal when the value represented by said third set of counting signals is greater than the value represented by said fourth set of counting signals indicative of said second clock pulse generator being in an apparent failure state; and
logic means connected to said first and second comparison means and to said first and second clock pulse generators for applying said second sequence of repetitive signal pulses to said clock output terminal in the presence of either said first inequality signal or said third inequality signal and for applying said first sequence of repetitive signal pulses to said clock output terminal in the presence of either said second inequality signal or said fourth inequality signal whereby an uninterrupted sequence of clock output pulses is maintained in the presence of an apparent failure in one of said clock pulse generators.

15. A method for generating a clock output signal at an output terminal in the presence of a failure in a clock circuit comprising a first clock pulse generator and a second clock pulse generator comprising the steps of generating at said first clock pulse generator a first sequence of repetitive signal pulses and generating at said second clock pulse generator a second sequence of repetitive signal pulses, Characterized in that the method further comprises the steps of:
A. counting pulses of said first sequence of repetitive signal pulses and generating a first set of counting signals;
B. counting pulses of said second sequence of repetitive signal pulses and generating a second set of counting signals;
C. comparing said first and said second sets of counting signals;
D. generating a first inequality signal when the value represented by said first set of counting signals is greater than the value represented by said second set of counting signals, and generating a second inequality signal when the value represented by said second set of counting signals is greater than the value represented by said first set of counting signals;
E. generating said clock output signal at said output terminal correspondent to said first sequence of repetitive signal pulses in the presence of said first inequality signal, and generating said clock output signal at said output terminal correspondent to said second sequence of repetitive signal pulses in the presence of said second inequality signal.

16. A method for generating a clock output signal in accordance with claim 15 characterized in that the method further includes the steps of:
A. generating first and second sequences of complementary repetitive signal pulses which are the logical inverse of said first and said second sequences of repetitive signal pulses;
B. counting pulses of said first sequence of complementary signal pulses and generating a third set of counting signals;
C. counting pulses of said second sequence of complementary signals and generating a fourth set of counting signals;
D. further generating said first inequality signal when the value represented by said third set of counting signals is greater than the value represented by said fourth set of counting signals, and further generating said second inequality signal when the value represented by said fourth set of counting signals is greater than the value represented by said third set of counting signals.

17. A method for generating a clock output signal in accordance with claim 16 characterized in that the method further comprises the steps of:
A. generating a first failure indication signal a predetermined period of time after generating said first inequality signal;
B. generating a second failure indication signal a predetermined period of time after generation of said second inequality signal;
C. inhibiting the further generation of inequality signals in the presence of either of said failure indication signals.

* * * * *